(12) United States Patent
Takashima (10) Patent No.: US 7,057,221 B2
(45) Date of Patent: Jun. 6, 2006

(54) SEMICONDUCTOR MEMORY DEVICE

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 10/615,181

(22) Filed: Jul. 9, 2003

(65) Prior Publication Data

US 2004/0056291 A1 Mar. 25, 2004

(30) Foreign Application Priority Data

Jul. 10, 2002 (JP) ............................. 2002-200776

(51) Int. Cl.
*H01L 29/72* (2006.01)
(52) U.S. Cl. ....................... 257/295; 257/296; 365/145
(58) Field of Classification Search ................ 257/295, 257/296; 365/145
See application file for complete search history.

(56) References Cited

U.S. PATENT DOCUMENTS 3,537,079 A * 10/1970 Feisel ......................... 365/145

5,629,888 A * 5/1997 Saito et al. .................. 365/145

OTHER PUBLICATIONS

D. Takashima, et al., IEEE Journal of Solid-State Circuits, vol. 33, No. 5, pp. 787-792, "High-Density Chain Ferroelectric Random Access Memory (Chain Fram)", May 1998.

S. Onishi, et al., IEDM, pp. 843-846, "A Half-Micron Ferroelectric Memory Cell Technology With Stacked Capacitor Structure", 1994.

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A semiconductor memory device comprises a ferroelectric element, an electric field applied to the ferroelectric element being controlled to relatively shift a position of a first atom with respect to a position of another atom and to store data at stabilized positions as remanent polarization, wherein the ferroelectric element stores two-bit information by having total four stabilized positions of the first atom, which include first stabilized two positions in a first direction and second stabilized two positions in a second direction perpendicular to the first direction.

34 Claims, 7 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2002-200776, filed Jul. 10, 2002, the entire contents of which are incorporated herein by reference.

BACKGROUND OF THE INVENTION

1. Field of the Invention

This invention relates to a semiconductor memory device, and more particularly to a structure of a ferroelectric capacitor for storage of information and a circuit of ferroelectric memory cells each using the above ferroelectric capacitor and is used in a ferroelectric memory, for example.

2. Description of the Related Art

Semiconductor memories are utilized in the main memories of large-scale computers, personal computers, domestic electric appliances, portable telephones or the like. Various types of semiconductor memories such as volatile DRAMs (Dynamic RAMs), SRAM (Static RAMs), nonvolatile MROMs (Mask ROMs), Flash EEPROMs and the like are put on the market. Particularly, even though the DRAM is a volatile memory, it is excellent in the low cost (the cell area is ¼ times that of the SRAM) and the high-speed operation (Flash EEPROM) and, at present, it substantially dominantly occupies the market. The rewritable and nonvolatile flash memory is of a nonvolatile type and data stored therein can be maintained even if the power supply thereof is turned OFF. However, since the EEPROM has disadvantages that the number of rewriting (W/E) operation times is only approximately $10^6$, the write time of approximately several microseconds is required and high voltage (12V to 22V) is required for writing, it is not put on the market as widely as the DRAM.

On the other hand, nonvolatile ferroelectric memories each using a ferroelectric capacitor are of a nonvolatile type and have advantages that the number of rewriting (W/E) operation times is approximately $10^{12}$, the read/write (R/W) time is approximately the same as that of the DRAM and the 3V operation can be performed. Therefore, they can be dominantly used in the entire market and various makers study and develop the nonvolatile ferroelectric memories.

Figure 16A:
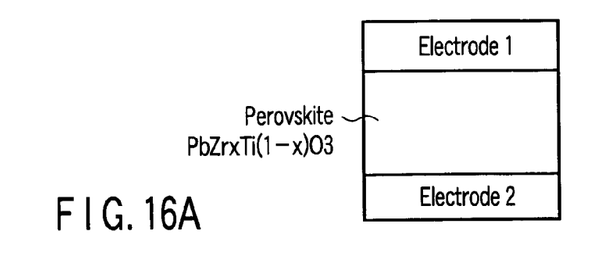
FIGS. 16A to 16D show the structure of the conventional ferroelectric capacitor, an equivalent circuit of a memory cell, the crystal structure of a ferroelectric film and the polarization position in which information is stored.
Figure 16B:
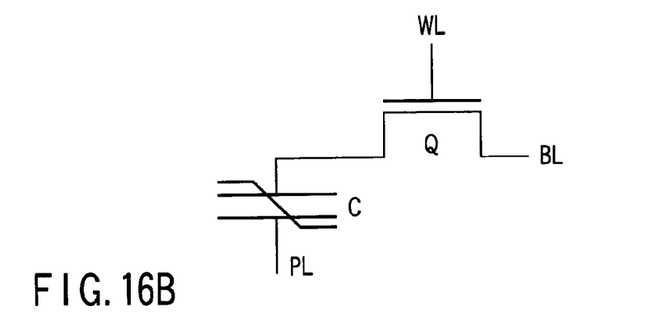

FIGS. 16A and 16B respectively show the structure of the conventional ferroelectric capacitor and an equivalent circuit of a ferroelectric memory using the ferroelectric capacitor.

The ferroelectric capacitor shown in FIG. 16A includes two electrodes 1, 2 and a ferroelectric film of perovskite structure of $PbZrxTi(1-x)O_3$, for example, which is disposed between the electrodes and in which the relation between the electric field and remanent magnetic field has a hysteresis characteristic. With the above structure, voltage is applied between the two electrodes 1, 2 to generate an electric field and change the direction of polarization and thus one-bit information can be stored.

The ferroelectric memory cell shown in FIG. 16B includes a selection transistor Q and the ferroelectric capacitor C described before which are connected in series between a data line (bit line BL) and a plate line PL.

Therefore, data can be read or written with respect to the ferroelectric capacitor C via the bit line BL by setting the selection transistor Q into the ON state by use of drive voltage of a word line WL shown in FIG. 16B and causing inversion of polarization by use of drive voltage of the plate line PL.

Figure 16C:
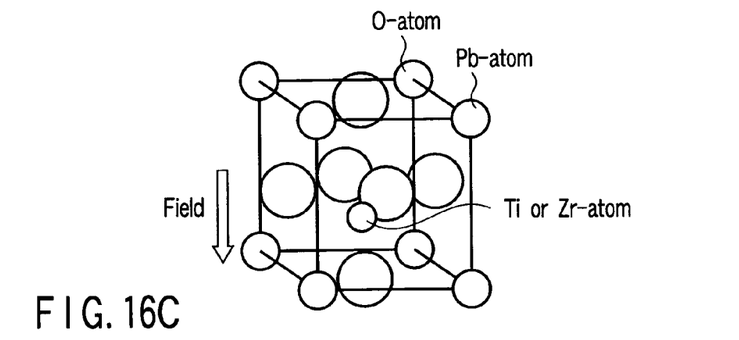
Figure 16D:
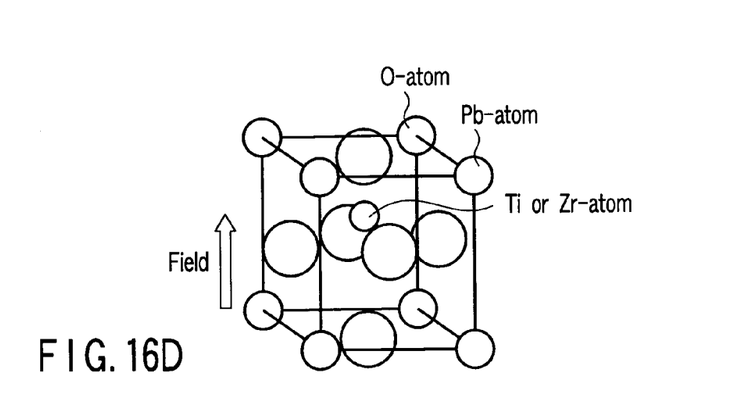

FIGS. 16C and 16D show the crystal structure of the ferroelectric film of the ferroelectric capacitor shown in FIG. 16A and the polarization position in which information is stored.

In order to form the ferroelectric film, generally, a material having an $ABO_3$ or $ABxC(1-x)O_3$ perovskite structure such as PZT ($PbZrxTi(1-x)O_3$) is used. For example, $PbZrxTi(1-x)O_3$ has a perovskite structure in which a Ti-atom or Zr-atom whose atom position is moved by application of an electric field is arranged in the structure surrounded by O-atoms and Pb-atoms.

If voltage is applied between the electrodes lying at both ends to generate an electric field in a downward direction as shown in FIG. 16C, the tetravalent Ti-atom is moved or shifted in the downward direction from the center and stabilized in a position below the center after the electric field is returned to "0". This is because a low potential portion exists in a portion below the center.

If voltage is applied between the electrodes lying at both ends to generate an electric field in an upward direction as shown in FIG. 16D, the tetravalent Ti-atom is moved in the upward direction from the center and stabilized in a position above the center after the electric field is returned to "0". This is because a low potential portion also exists in a portion above the center.

However, in the conventional ferroelectric memory cell as described above, only two values ("1" and "0"), that is, only one-bit information can be stored in one ferroelectric capacitor and the development in high integration has limitations.

The inventor of this application proposed the configuration which attained the high integration density of ferroelectric memory cells according to "Semiconductor Memory Device and System having the same mounted thereon" of Jpn. Pat. Appln. KOKAI Publication No. 10-255483, "Semiconductor Memory Device" of Jpn. Pat. Appln. KOKAI Publication No. 11-177036, "Semiconductor Memory Device" of Japanese Patent Application No. 2000-22010 and the like. The above proposals relate to a system of a ferroelectric memory cell unit configured by connecting a ferroelectric capacitor and selection transistor in parallel and connecting a plurality of parallel-connected circuits in series. However, only two-value information can be stored in one ferroelectric capacitor.

As described above, the ferroelectric memory using the conventional ferroelectric memory cells can store only two-value information in one ferroelectric film and has a limitation in an increase in the integration density.

BRIEF SUMMARY OF THE INVENTION

According to a first aspect of the present invention, a semiconductor memory device comprises a ferroelectric element, an electric field applied to the ferroelectric element being controlled to relatively shift a position of a first atom with respect to a position of another atom and to store data at stabilized positions as remanent polarization, wherein the ferroelectric element stores two-bit information by having total four stabilized positions of the first atom, which include first stabilized two positions in a first direction and second stabilized two positions in a second direction perpendicular to the first direction.

According to a second aspect of the present invention, a semiconductor memory device comprises a ferroelectric element composed of a ferroelectric material having one structure selected from an $ABO_3$ crystal structure and an $ABO_3$ perovskite structure, both of the $ABO_3$ crystal structure and the $ABO_3$ perovskite structure being composed of atoms A, atoms B and atoms O, an electric field applied to the ferroelectric element being controlled so that a position of each of the atoms B is relatively shifted for positions of the atoms A and the atoms O to store data at the stabilized positions as remanent polarization, wherein the ferroelectric element stores two-bit information by having total four stabilized positions of the atoms B, which include first stabilized two positions in a first direction and second stabilized two positions in a second direction perpendicular to the first direction.

According to a third aspect of the present invention, a semiconductor memory device comprises a ferroelectric element composed of a ferroelectric material having one structure selected from an $ABxC(1-x)O_3$ crystal structure and an $ABxC(1-x)O_3$ perovskite structure, both of the $ABxC(1-x)O_3$ crystal structure and the $ABxC(1-x)O_3$ perovskite structure being composed of at least atoms A, atoms B, atoms C and atoms O, an electric field applied to the ferroelectric element being controlled to relatively shift a position of one atom selected from the atoms B and atoms C with respect to positions of the atoms A and atoms O and permit data to be stored in stabilized positions as remanent polarization, wherein the ferroelectric element stores two-bit information by having total four stabilized positions of one atom selected from the atoms B and atoms C, which include first stabilized two positions in a first direction and second stabilized two positions in a second direction perpendicular to the first direction.

According to a fourth aspect of the present invention, a semiconductor memory device comprises a ferroelectric element having one structure selected from an $ABO_3$ crystal structure and an $ABO_3$ perovskite structure, both of the $ABO_3$ crystal structure and the $ABO_3$ perovskite structure being composed of at least atoms A, atoms B and atoms O, an electric field applied to the ferroelectric element being controlled to relatively shift a position of the atoms B with respect to positions of the atoms A and atoms O and permit data to be stored in stabilized positions as remanent polarization, wherein the ferroelectric element stores multi-bit information by having total six stabilized positions of the atoms B, which include first stabilized two positions in a first direction, second stabilized two positions in a second direction perpendicular to the first direction and third stabilized two positions in a third direction perpendicular to the first and second directions.

According to a fifth aspect of the present invention, a semiconductor memory device comprises a ferroelectric element having one structure selected from an $ABxC(1-x)O_3$ crystal structure and an $ABxC(1-x)O_3$ perovskite structure, both of the $ABxC(1-x)O_3$ crystal structure and the $ABxC(1-x)O_3$ perovskite structure being composed of at least atoms A, atoms B, atoms C and atoms O, an electric field applied to the ferroelectric element being controlled to relatively shift a position of one atom selected from the atoms B and atoms C with respect to positions of the atoms A and atoms O and permit data to be stored in stabilized positions as remanent polarization, wherein the ferroelectric element stores multi-bit information by having total six stabilized positions of one atom selected from the atoms B and atoms C, which include two stabilized positions in a first direction, two stabilized positions in a second direction perpendicular to the first direction and two stabilized positions in a third direction perpendicular to the first and second directions.

According to a sixth aspect of the present invention, a semiconductor memory device comprises a ferroelectric element, an electric field applied to the ferroelectric element being controlled to relatively shift a position of a first atom with respect to a position of another atom and permit data to be stored in stabilized positions as remanent polarization, wherein the ferroelectric element stores multi-bit information by having total six stabilized positions of the first atom, which include first stabilized two positions in a first direction, second stabilized two positions in a second direction perpendicular to the first direction and third stabilized two positions in a third direction perpendicular to the first and second directions.

According to a seventh aspect of the present invention, a semiconductor memory device comprises a ferroelectric element, and at least three electrodes in contact with the ferroelectric element.

According to an eighth aspect of the present invention, a semiconductor memory device comprises a ferroelectric element, and at least three electrodes in contact with the ferroelectric element, wherein at least one of the electrodes is connected to a data readout line via a transistor.

According to a ninth aspect of the present invention, a semiconductor memory device comprises a ferroelectric element, wherein a first atom is shifted to at least three positions on a two-dimensional plane in the ferroelectric element to hold data of at least three values.

According to a tenth aspect of the present invention, a semiconductor memory device comprises a ferroelectric element, wherein a first atom is shifted to at least three positions on a three-dimensional plane in the ferroelectric element to hold data of at least three values.

According to an eleventh aspect of the present invention, a semiconductor memory device comprises a ferroelectric element, and first, second, third and fourth electrodes, wherein the first and second electrodes are respectively connected to source and drain terminals of a first transistor and the third and fourth electrodes are respectively connected to source and drain terminals of a second transistor to configure one memory cell and information of at least two bits is stored in the memory cell.

DETAILED DESCRIPTION OF THE EMBODIMENTS

There will now be described embodiments of this invention in detail with reference to the accompanying drawings.

First Embodiment

Figure 1A:
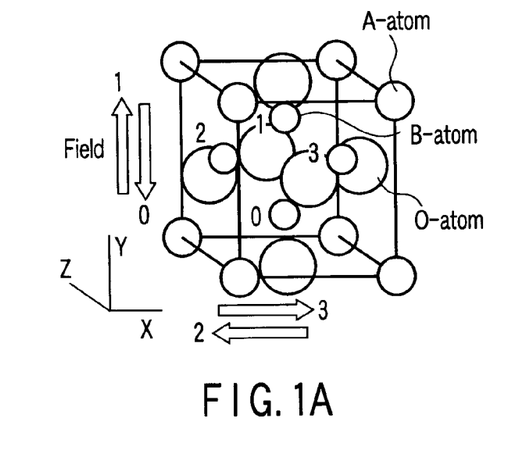
FIGS. 1A to 1D are views each showing a crystal structure of a ferroelectric film of a ferroelectric capacitor used in a ferroelectric memory cell according to a first embodiment and polarization positions in which information is stored.
Figure 1B:
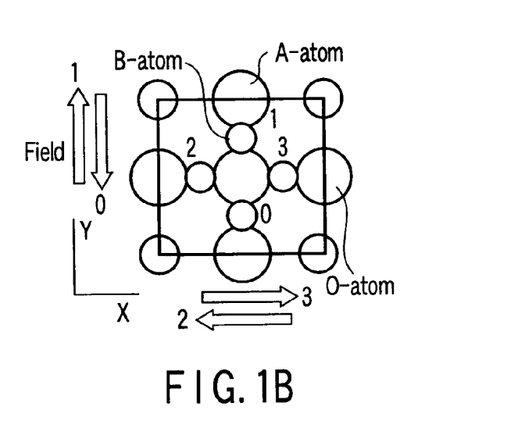

FIG. 1A is a view showing the crystal structure of a ferroelectric film of a ferroelectric capacitor used in a ferroelectric memory cell of a ferroelectric memory according to a first embodiment and polarization positions in which information is stored.

As the ferroelectric film of the ferroelectric capacitor, an example is shown which comprises a ferroelectric material having an $ABO_3$ crystal structure or $ABO_3$ perovskite structure each of which includes at least atoms A, atom B and atoms O. In this case, the structure of the ferroelectric film is kept unchanged even if it is rotated by 90° along any one of the X, Y and Z axes.

In the crystal structure of the cubic system, there are provided eight A-toms, six O-atoms and one tetravalent or bivalent B-atom located at the center. The B-atom is stabilized in a low potential point which lies at a point shifted from the center of the crystal (a point separated in a two-dimensional direction from the center of the crystal) and the stabilized point corresponds to a polarization position in which information is stored.

As shown in FIG. 1A, a positive electric field or negative electric field in the Y-axis direction is applied to the ferroelectric film to shift the B-atom relatively to the A-atoms or O-atoms so that data will be stored as remanent polarization in stabilized points which lie at both ends in the Y-axis direction. Further, a positive electric field or negative electric field in the X-axis direction is applied to the ferroelectric film to shift the B-atom relatively to the A-atoms or O-atoms so that data will be stored as remanent polarization in stabilized points which lie at both ends in the X-axis direction.

Figures 1C, 1D:
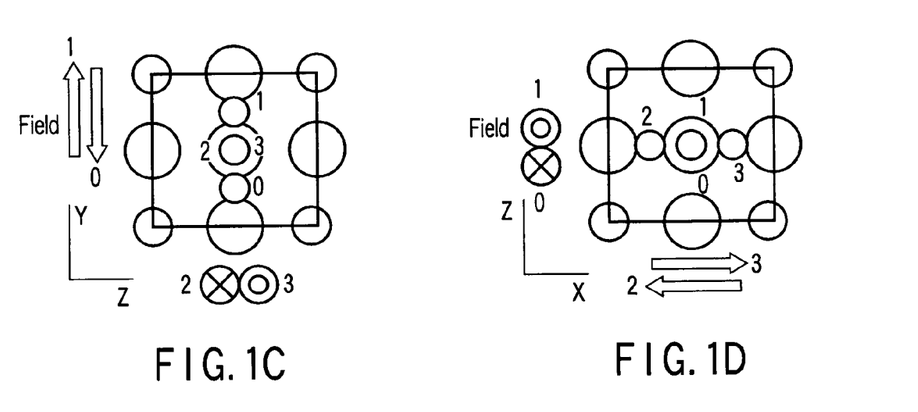

In order to clearly show the ferroelectric film of FIG. 1A, FIGS. 1B to 1D show polarization positions when the crystal structure of the ferroelectric film is viewed from the X-Y, Y-Z and Z-X planes. In FIGS. 1C and 1D, a symbol of a double circle indicates an electric field in a direction towards the observer and a symbol of an X mark in a circle indicates an electric field in a direction away from the observer. This is applied to the following drawings.

That is, the ferroelectric capacitor of the above embodiment can permit four-value information or two-bit information to be stored in one ferroelectric film in total four points of the B-atom including two points at two ends in a first direction and two points at two ends in a second direction perpendicular to the first direction by applying an electric field to the ferroelectric film in a two-dimensional direction.

In other words, the ferroelectric capacitor of the above embodiment is formed based on the fact that a specified atom has stabilized points with respect to another atoms in three or more positions on the two-dimensional plane in the perovskite structure in one ferroelectric film.

At the write time, in order to selectively shift a specified atom to a plurality of stabilized points, voltages applied to a plurality of, for example, three or more electrodes arranged near the ferroelectric film are controlled to generate three or more electric field vectors in two-dimensional directions. Thus, the specified atom is shifted between the three or more stabilized points so as to write polarization data of three or more values. At the read time, data of three or more values can be determined by applying voltage to one or more electrodes and determining a charge amount discharged from another electrode. As a result, a ferroelectric memory which can be formed with high density and high integration can be realized.

In the conventional ferroelectric capacitor, two-value information is only stored in one ferroelectric film by applying an electric field to the ferroelectric film in one-dimensional direction to shift the B-atom and permitting the B-atom to have stabilized points in low potential portions which correspond to both ends in the one-dimensional direction.

As the ferroelectric element (in this example, which is the ferroelectric film of the ferroelectric capacitor), a ferroelectric material having an $ABxC(1-x)O_3$ crystal structure or an $ABxC(1-x)O_3$ perovskite structure each of which is composed of at least atoms A, atoms B, atoms C and atoms O can be used. In this case, an electric field applied in the two-dimensional direction of the ferroelectric film is controlled to relatively shift the position of a selected one of the atoms B or atoms C with respect to the atoms A or atoms O and permit data to be stored in the stabilized position as remanent polarization.

The material of the ferroelectric film is a ferroelectric material having an $ABO_3$ crystal structure or an $ABO_3$ perovskite structure or a ferroelectric material having an $ABxC(1-x)O_3$ crystal structure or an $ABxC(1-x)O_3$ perovskite structure. As a more concrete example, a material containing $BaTiO_3$, $PbZrxTi(1-x)O_3$, $(BiLa)_4Ti_3O_{12}$, $Bi_4Ti_3O_{12}$, $SrBi_2Ta_2O_9$ can be given. For example, in PZT $(PbZrxTi(1-x)O_3)$, the A-atom corresponds to a Pb atom, the O-atom corresponds to an O (oxygen) atom, and the B-atom corresponds to a Ti atom or Zr atom.

Since the crystal axes and potential distribution of the ferroelectric film are changed according to the material and composition thereof, the direction of the electric field can be set to completely coincide with the shifting direction of the B-atom. Further, even when an angle between the direction of the electric field and the shifting direction of the B-atom occurs to some extent, the B-atom can be shifted to a stabilized point if the electric field has a certain intensity as the resolved vector in the shifting direction of the B-atom.

For example, $SrBi_2Ta_2O_9$ has a layered perovskite structure and is not symmetrical with respect to the X axis, Y axis and Z axis. However, since it can be made symmetrical with respect to the X axis and Y axis, stabilized points can be attained in the two-dimensional direction and multi-value data can be stored.

It is not necessary that the X axis, Y axis and Z axis will correspond to (100), (110), (111) crystal axes, a, b, c axes or the like. That is, the angle of the axes may be changed according to the crystal direction of the underlying layer before formation of the ferroelectric film, and the direction and the number of stabilized points may also be changed according to the composition and material of the crystal. Therefore, it is sufficient if the X axis, Y axis and Z axis are deviated by 90° from one another.

Second Embodiment

The axial direction having stabilized positions of the B-atom is changed if the composition ratio of the material of the ferroelectric film is changed. In the second embodiment, a case is explained where the axial direction having stabilized positions is changed by 45° by changing the composition ratio of Zr and Ti in $PbZrxTi(1-x)O_3$ shown, for example, in the first embodiment.

Figure 2:
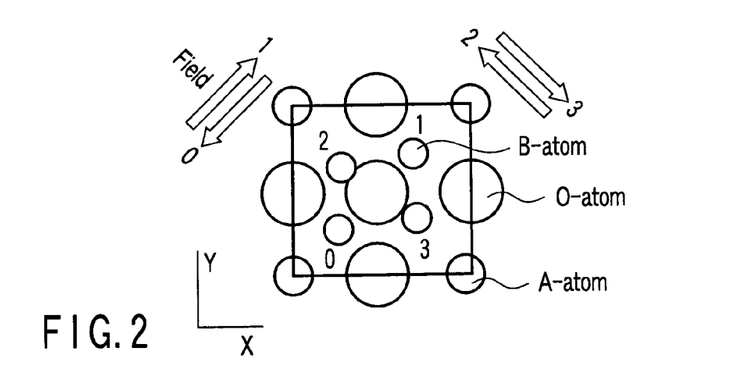
FIG. 2 is a view showing the crystal structure and polarization positions in a case where $PbZrxTi(1-x)O_3$ is used as a material of a ferroelectric film of a ferroelectric memory cell according to a second embodiment.

FIG. 2 shows the crystal structure in the case where $PbZrxTi(1-x)O_3$ is used as a material of a ferroelectric film of a ferroelectric memory cell according to the second embodiment and the polarization positions in which information is stored as viewed from the X-Y plane.

In the crystal structure, the directions of the stabilized points are deviated substantially by 45° with respect to the X axis and Y axis in comparison with the structure shown in FIG. 1A. Thus, the B-atom can reach two stabilized points by a first electric field of a direction which is deviated by 45° with respect to the X axis and Y axis and an electric field in a direction opposite to the first electric field, and further can reach two stabilized points by a second electric field which is deviated by 90° with respect to the first electric field and an electric field in a direction opposite to the second electric field. Therefore, four-value information can be stored in one ferroelectric film.

Third Embodiment

In the third embodiment, a case where the material of the ferroelectric film having a composition different from that of $PbZrxTi(1-x)O_3$ described before is used or a case where the material of the ferroelectric film having a larger number of stabilized points of the B-atom is used is explained.

Figure 3:
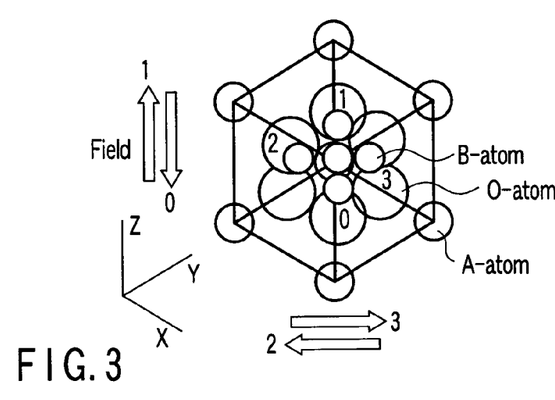
FIG. 3 is a view showing the crystal structure and polarization positions of a ferroelectric film of a ferroelectric memory cell according to a third embodiment.

FIG. 3 is a view showing the crystal structure and polarization positions of a ferroelectric film of a ferroelectric memory cell according to the third embodiment.

In the crystal structure, the directions of the stabilized points are deviated substantially by 45° with respect to the X axis and Y axis in comparison with the structure shown in FIG. 1A. Thus, the B-atom can reach two stabilized points by a first electric field of a direction which is deviated by 45° with respect to the X axis, Y axis and Z axis and an electric field in a direction opposite to the first electric field, and further can reach two stabilized points by a second electric field which is deviated by 90° with respect to the first electric field and an electric field in a direction opposite to the second electric field. Therefore, four-value data can be stored in one ferroelectric film.

Fourth Embodiment

In the fourth embodiment, a case is explained where six-value data is stored in one ferroelectric film by use of stabilized points in the three-dimensional direction in the crystal structure of the ferroelectric film.

Figure 4A:
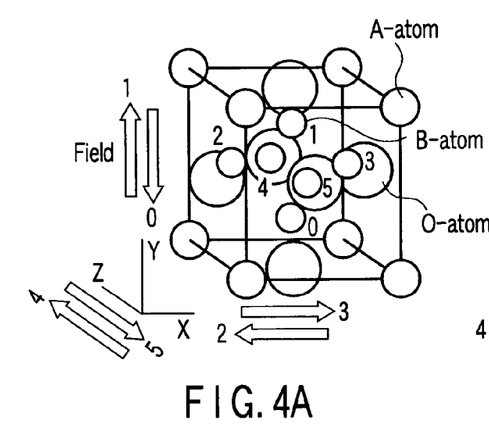
FIGS. 4A and 4B are views each showing the crystal structure and polarization positions of a ferroelectric film of a ferroelectric memory cell according to a fourth embodiment.

FIG. 4A is a view showing the crystal structure and polarization positions of a ferroelectric film of a ferroelectric memory cell according to the fourth embodiment.

Figure 4B:
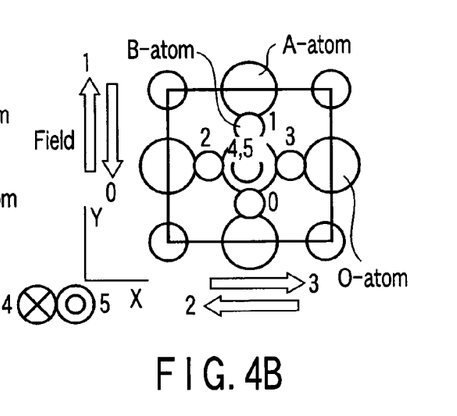

In order to clearly show the ferroelectric film of FIG. 4A, FIG. 4B shows polarization positions when the crystal structure of the ferroelectric film is viewed from the X-Y plane. In this case, as the ferroelectric film of the ferroelectric capacitor, an example having the $ABO_3$ perovskite crystal structure is shown and the structure can be kept unchanged even if it is rotated by 90° in any direction of the X axis, Y axis and Z axis shown in the drawing.

In the crystal structure, there are provided eight A-atoms, six O-atoms and one tetravalent or bivalent B-atom located at the center. For example, in PZT $(PbZrxTi(1-x)O_3)$, a perovskite structure is provided in which the A-atom corresponds to a Pb atom, the O-atom corresponds to an O (oxygen) atom, the B-atom corresponds to a Ti atom or Zr atom.

In this case, the B-atom has no low potential point at the center of the crystal and is stabilized at a low potential point which lies at a point (a point separated in the three-dimensional direction from the center of the crystal) deviated from the center of the crystal. The stabilized point is a polarization position in which information is stored.

That is, two stabilized points are attained at both ends in the Y-axis direction by applying positive and negative electric fields in the Y-axis direction to shift the B-atom (relatively to the A-atom or O-atom). Also, two stabilized points are attained at both ends in the X-axis direction by applying positive and negative electric fields in the X-axis direction to shift the B-atom. Further, two stabilized points are attained at both ends in the Z-axis direction by applying positive and negative electric fields in the Z-axis direction to shift the B-atom. As a result, six-value information can be stored in one ferroelectric film.

That is, the ferroelectric capacitor of the above embodiment can store six-value information, that is, three-bit information in one ferroelectric film by use of stabilized positions of the B-atom which include two points at two ends in a first direction, two points at two ends in a second direction perpendicular to the first direction and two points at two ends in a third direction perpendicular to the first and second directions by applying the electric field in the three-dimensional direction of the ferroelectric film.

In the conventional ferroelectric capacitor, two-value information is only stored in one ferroelectric film by applying an electric field to the ferroelectric film in one-dimensional direction to shift the B-atom and permitting the B-atom to have stabilized points in low potential portions at two ends in the one-dimensional direction.

In other words, the ferroelectric capacitor of the above embodiment is formed based on the fact that a specified atom has stabilized points with respect to another atoms in six or more positions on the three-dimensional plane in the perovskite structure in one ferroelectric film. Then, polarization data of three or more values can be stored by controlling voltages of the electrodes to shift the specified atom between the six or more stabilized points. As a result, a ferroelectric memory which can be formed with high density and high integration can be realized.

Since the crystal axes and potential distribution of the ferroelectric film are changed according to the material and composition thereof, the direction of the electric field can be set to completely coincide with the shifting direction of the B-atom. Further, even when an angle between the direction of the electric field and the shifting direction of the B-atom occurs to some extent, the B-atom can be shifted to a stabilized point if the electric field has a certain intensity as the resolved vector in the shifting direction of the B-atom.

As an example of the material of the ferroelectric film, a material containing $BaTiO_3$, $PbZr_xTi(1-x)O_3$, $(BiLa)_4Ti_3O_{12}$, $Bi_4Ti_3O_{12}$ can be given.

Fifth Embodiment

If the composition ratio of the material of the ferroelectric film is changed, the axial direction having stabilized positions of the B-atom is changed. In the fifth embodiment, a case is explained where the axial direction having the stabilized positions is changed by 45° by changing the composition ratio of Zr and Ti of $PbZr_xTi(1-x)O_3$ shown, for example, in the fourth embodiment.

Figure 5:
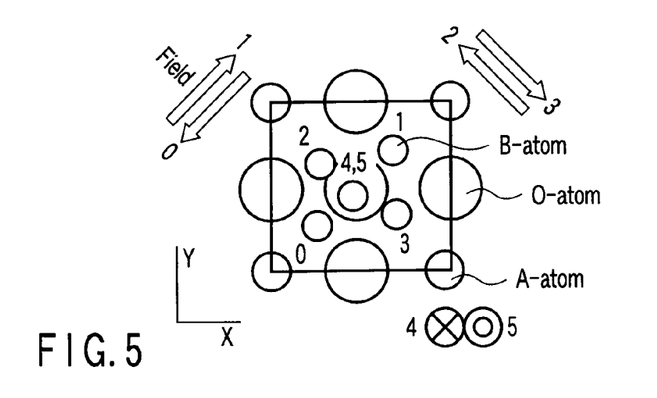
FIG. 5 is a view showing the crystal structure and polarization positions in a case where $PbZrxTi(1-x)O_3$ is used as a material of a ferroelectric film of a ferroelectric memory cell according to a fifth embodiment.

FIG. 5 shows the crystal structure and polarization positions as viewed from the X-Y plane in the case where $PbZr_xTi(1-x)O_3$ is used as the material of the ferroelectric film of the ferroelectric memory cell according to the fifth embodiment.

In the crystal structure, the directions of the stabilized points are deviated substantially by 45° with respect to the X axis and Y axis in comparison with the structure shown in FIG. 4B. Thus, the B-atom can reach two stabilized points by a first electric field of a direction which is deviated by 45° with respect to the X axis and Y axis and by an electric field in a direction opposite to the first electric field, and can reach two stabilized points by a second electric field which is deviated by 90° with respect to the first electric field and an electric field in a direction opposite to the second electric field. Further, it can reach two stabilized points by a third electric field which is deviated by 90° with respect to the first and second electric fields and by an electric field in a direction opposite to the third electric field. Therefore, six-value information can be stored in one ferroelectric film.

Sixth Embodiment

In the sixth embodiment, a case is explained where the material of the ferroelectric film having a composition different from that of $PbZr_xTi(1-x)O_3$ described before is used or the material of the ferroelectric film having a larger number of stabilized points of the B-atom is used.

Figure 6:
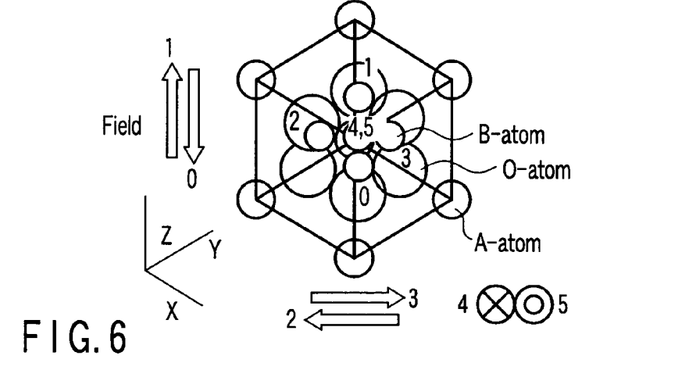
FIG. 6 is a view showing the crystal structure and polarization positions of a ferroelectric film of a ferroelectric memory cell according to a sixth embodiment.

FIG. 6 is a view showing the crystal structure and polarization positions of the ferroelectric film of the ferroelectric memory cell according to the sixth embodiment.

In the crystal structure, the directions of the stabilized points are deviated substantially by 45° with respect to the X axis, Y axis and Z axis in comparison with the crystal structure shown in FIG. 5. Thus, the B-atom can reach two stabilized points by a first electric field of a direction which is deviated by 45° with respect to the X axis, Y axis and Z axis and by an electric field in a direction opposite to the first electric field, and can reach two stabilized points by a second electric field which is deviated by 90° with respect to the first electric field and by an electric field in a direction opposite to the second electric field. Therefore, the ferroelectric film can be used as a four-value memory. Further, it can reach two stabilized points by a third electric field which is deviated by 90° with respect to the first and second electric fields and by an electric field in a direction opposite to the third electric field. Therefore, six-value information can be stored in one ferroelectric film.

Seventh Embodiment

In the seventh embodiment, a case is explained where the first to third embodiments are expanded to a two-dimensional space.

Figures 7A, 7B:
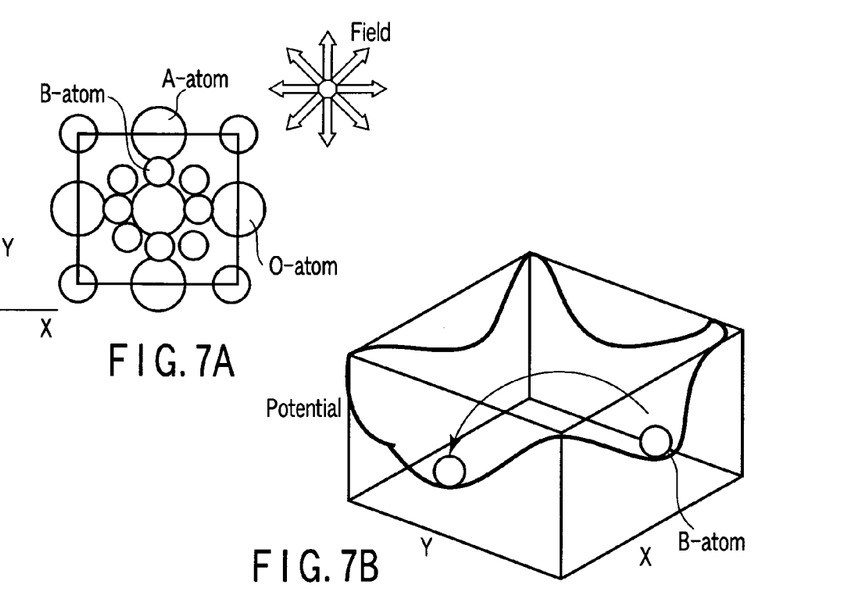
FIGS. 7A and 7B are respectively a view showing the crystal structure of a ferroelectric film of a ferroelectric memory cell according to a seventh embodiment and a diagram showing one example of a potential distribution curve.

FIG. 7A shows the crystal structure of a ferroelectric film of a ferroelectric memory cell according to the seventh embodiment as viewed from the X-Y plane.

If an electric field is applied to a desired direction of 0 to 360° with respect to the X plane and Y plane in the crystal structure, a large number of stabilized points of the B-atom lie in positions separated by a predetermined distance or more from the center of the crystal. Therefore, multi-value information can be stored in one ferroelectric film. In this example, eight-value information, that is, three-bit information can be stored.

FIG. 7B shows a potential distribution curve in the X-Y plane of the crystal structure of the ferroelectric film.

As shown in FIG. 7B, if four stabilized points of the B-atom are present in the crystal, four-value information can be stored as in the ferroelectric memory cell according to the first to third embodiments. Further, if a larger number of stabilized points of the B-atom are present in positions separated by a predetermined distance or more from the center of the crystal, information of multi-values corresponding in number to the number of stabilized points can be stored.

Eighth Embodiment

In the eighth embodiment, a case is explained where the fourth to sixth embodiments are expanded to whole three-dimensional space.

Figure 8:
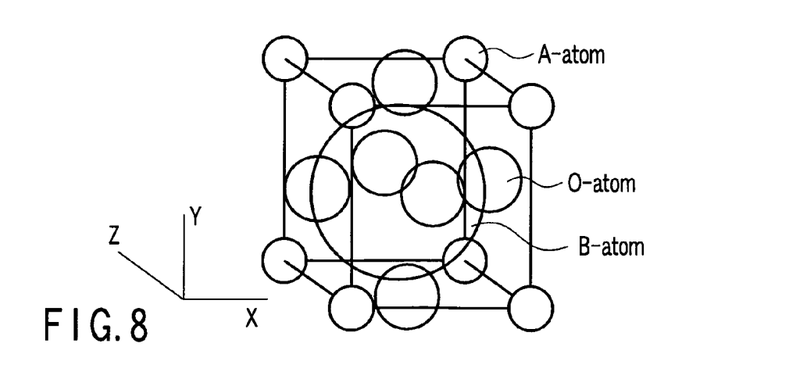
FIG. 8 is a view showing the crystal structure of a ferroelectric film of a ferroelectric memory cell according to an eighth embodiment.

FIG. 8 is a view showing the crystal structure of a ferroelectric film of a ferroelectric memory cell according to the eighth embodiment.

If an electric field is applied to a desired direction of 0 to 360° with respect to the X plane, Y plane and Z plane in the crystal structure, a large number of stabilized points of the B-atom lie in positions separated by a predetermined distance or more from the center of the crystal. Therefore, multi-value information can be stored in one ferroelectric film. In this example, the stabilized position is expressed by use of the surface of a sphere and information of a limitless number of bits (or an analog value) can be stored. The actual stabilized point may lie in a limited location in the three-dimensional space depending on the type of the crystal and the distance from the center of the crystal to the stabilized point may be different.

Ninth Embodiment

Figure 9:
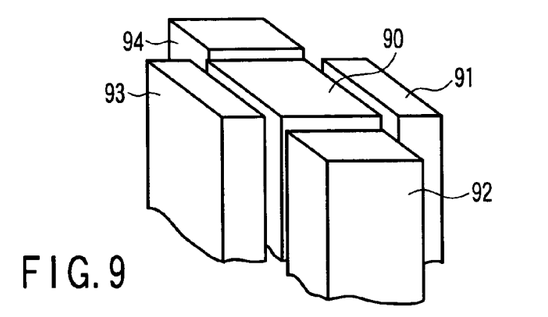
FIG. 9 is a perspective view showing the structure of electrodes and a ferroelectric film of a ferroelectric capacitor of a ferroelectric memory cell according to a ninth embodiment.

FIG. 9 is a perspective view showing the structure of electrodes and a ferroelectric film of a ferroelectric capacitor in a ferroelectric memory cell according to the ninth embodiment.

The ferroelectric capacitor has electrodes 91 to 94 arranged on four side surfaces of a ferroelectric film (for example, PZT) 90. As described before with reference to the first to third embodiments, a structure which can store multi-value information by applying electric fields can be realized. In this case, as shown in FIG. 9, the four electrodes 91 to 94 can be arranged in an erected state on an Si substrate (not shown) or the four electrodes can be rotated by 90° and arranged in a parallel state with respect to the Si substrate (not shown).

Tenth Embodiment

Figure 10:
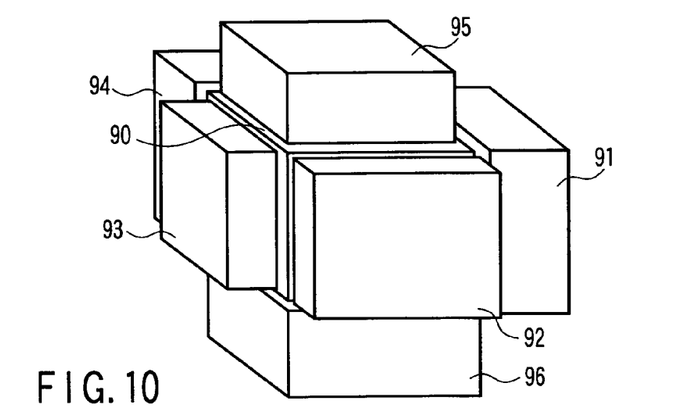
FIG. 10 is a perspective view showing the structure of electrodes and a ferroelectric film of a ferroelectric capacitor of a ferroelectric memory cell according to a tenth embodiment.

FIG. 10 is a perspective view showing the structure of electrodes and a ferroelectric film of a ferroelectric capacitor in a ferroelectric memory cell according to the tenth embodiment.

The ferroelectric capacitor has electrodes 91 to 96 arranged on six side surfaces of a ferroelectric film (for example, PZT) 90. As described before with reference to the fourth to sixth embodiments, a structure which can store multi-value information by applying electric fields can be realized.

Eleventh Embodiment

Figure 11:
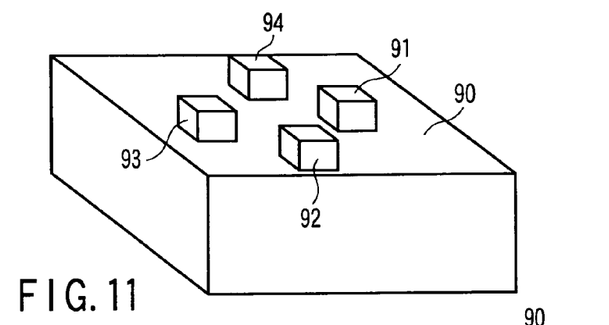
FIG. 11 is a perspective view showing the structure of electrodes and a ferroelectric film of a ferroelectric capacitor of a ferroelectric memory cell according to an eleventh embodiment.

FIG. 11 is a perspective view showing the structure of electrodes and a ferroelectric film of a ferroelectric capacitor in a ferroelectric memory cell according to the eleventh embodiment.

The ferroelectric capacitor has electrodes 91 to 94 arranged on the upper surface of a ferroelectric film (for example, PZT) 90. As described before with reference to the first to third embodiments, a structure which can store multi-value information by applying electric fields can be realized. In this case, the electric field will be transmitted from the electrodes 91 to 94 to which voltages are applied via a path configured by the front surface, internal portion and front surface of the ferroelectric film 90 and electrodes 91 to 94.

Twelfth Embodiment

Figure 12:
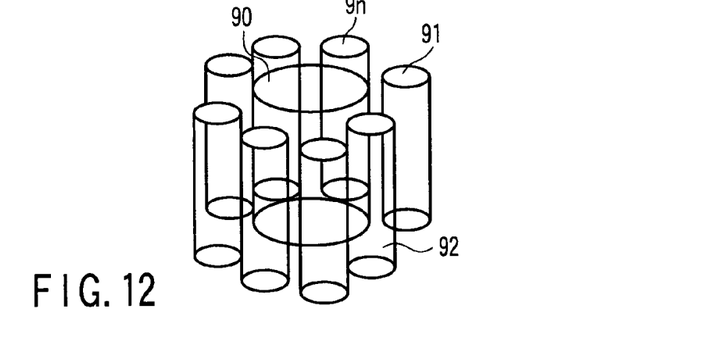
FIG. 12 is a perspective view showing the structure of electrodes and a ferroelectric film of a ferroelectric capacitor of a ferroelectric memory cell according to a twelfth embodiment.

FIG. 12 is a perspective view showing the structure of electrodes and a ferroelectric film of a ferroelectric capacitor in a ferroelectric memory cell according to the twelfth embodiment.

The ferroelectric capacitor has a plurality of electrodes 91 to 9n arranged along the side surface of a cylindrical ferroelectric film (for example, PZT) 90. Multi-value information can be stored in the ferroelectric film 90 by applying electric fields as described before with reference to the seventh embodiment.

In accordance with the present embodiment, a large number of electrodes are arranged on the six side surfaces of the ferroelectric film so that multi-value information can be stored in the ferroelectric film by applying electric fields as described before with reference to the eighth embodiment.

Next, examples of the ferroelectric memory cell using any one of the ferroelectric capacitors of the first to third, ninth and eleventh embodiments in which four-value data can be stored are explained with reference to thirteenth to fifteenth embodiments.

Thirteenth Embodiment

Figure 13A:
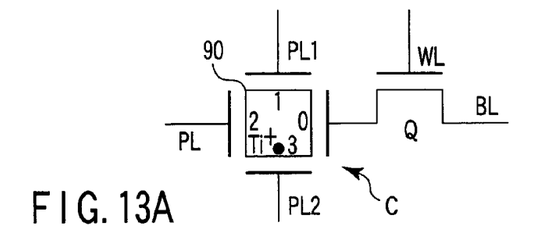
FIGS. 13A to 13C are an equivalent circuit diagram showing a ferroelectric memory cell according to a thirteenth embodiment and timing waveform diagrams showing examples of a read operation and write operation.

FIG. 13A shows an equivalent circuit of a ferroelectric memory cell according to the thirteenth embodiment.

A symbol of a square in FIG. 13A indicates a region of a ferroelectric film (for example, $PbZrxTi(1-x)O_3$) 90 of a ferroelectric capacitor. Stabilized points of a Ti-atom are provided in positions of "0" to "3" shown in the region and four-value information can be stored in the internal portion. In this case, the stabilized points of the Ti-atom are shown, but another atom may be used in the case of another perovskite structure. Four terminals corresponding to the positions "0" to "3" in the region of the ferroelectric film 90 indicate electrodes 0 to 3 and the electrodes 0 to 3 and ferroelectric film 90 configure one four-terminal capacitor C.

That is, the memory cell includes one four-terminal capacitor C having the electrodes 0 to 3 which are respectively connected to one terminal of a selection transistor Q and three plate lines PL1, PL2, PL3. The other end of the selection transistor Q is connected to a bit line BL and the gate thereof is connected to a word line WL.

Figure 13B:
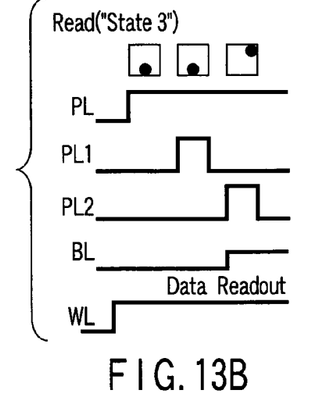

FIG. 13B shows an example of the read operation Read ("State 3") in the case where the Ti-atom of the memory cell lies in the position "3", for example.

The read operation is performed by raising the potential of the word line WL and by setting the selection transistor Q into the ON state. When the Ti-atom of the memory cell lies in the position "3", the position is not changed even if the potential of PL is raised. Further, the position is not changed even if the potential of PL1 is raised under the raised state of PL. However, if the potential of PL2 is raised, the electric field is directed to an upper rightward direction, and the Ti-atom is moved by the electric field, whereby charges are read onto the bit line BL.

Further, when the Ti-atom lies in the position "1", the position is not changed even if the potential of PL is raised. The position is not also changed under the raised state of PL even if the potential of PL2 is raised. However, if the potential of PL1 is raised, the electric field is directed to a lower rightward direction, and the Ti-atom is moved by the electric field, whereby charges are read onto the bit line BL.

Morefurther, when the Ti-atom lies in the position "2", the position is changed to "0" simply by raising the potential of PL and charges are generated on the bit line BL.

When the Ti-atom lies in the position "0", no charges are read onto the bit line BL even if any one of the potentials of PL, PL1, PL2 is raised.

Figure 13C:
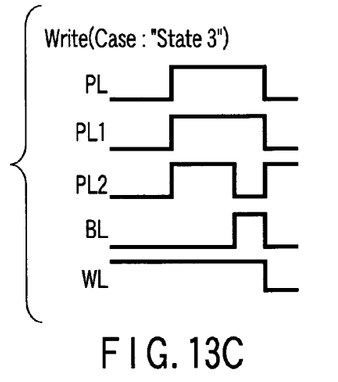

FIG. 13C shows an example of the write (rewrite) operation (Write "State 3") of writing a Ti-atom into the position "3" after the readout operation of the memory cell.

The write operation is performed by raising the potential of the word line WL and by setting the selection transistor into the ON state. Then, the Ti-atom can be moved (written) to a specified one of the positions "0" to "13" by lowering the potentials of the bit line BL and one of the plate lines PL, PL1, PL2 and by raising the potentials of the remaining lines.

In the example shown in FIG. 13C, the Ti-atom can be moved to the position "3" by lowering only the potential of the plate line PL2 in a state where the potentials of the lines BL, PL, PL1, PL2 are kept high. Thereafter, only the potential of PL2 is raised, the potentials of the remaining lines BL, PL, PL1 are lowered and the potential of the word line WL is lowered to turn OFF the selection transistor, thereby setting the operation state into the standby state.

By performing the above operation, four-value information can be read or written with respect to the memory cell shown in FIG. 13A.

Fourteenth Embodiment

Figure 14A:
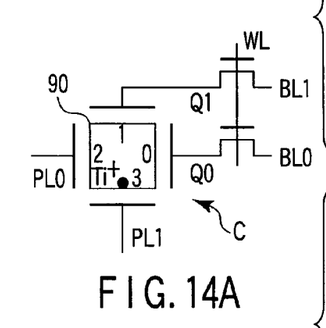
FIGS. 14A to 14E are an equivalent circuit diagram showing a ferroelectric memory cell according to a fourteenth embodiment and timing waveform diagrams showing examples of a read operation and write operation.

FIG. 14A shows an equivalent circuit of a ferroelectric memory cell according to the fourteenth embodiment.

A symbol of a square in FIG. 14A indicates a region of a ferroelectric film (for example, $PbZr_xTi(1-x)O_3$) 90 of a ferroelectric capacitor. Stabilized points of a Ti-atom are provided in positions of "0" to "3" shown in the above region and four-value information can be stored. In this case, the stabilized points of the Ti-atom are shown, but another atom may be used in the case of another perovskite structure. Four terminals corresponding to the positions "0" to "3" in the region of the ferroelectric film 90 indicate electrodes 0 to 3, and the electrodes 0 to 3, and ferroelectric film 90 configure one four-terminal capacitor C.

That is, the memory cell includes one four-terminal capacitor C having the electrodes 0 to 3 which are respectively connected to one-side terminals of two selection transistors Q0, Q1 and one-side ends of two plate lines PL0, PL1. The other ends of the selection transistors Q0, Q1 are connected to bit lines BL0, BL1 and the gates thereof are commonly connected to a word line WL.

Figure 14B:
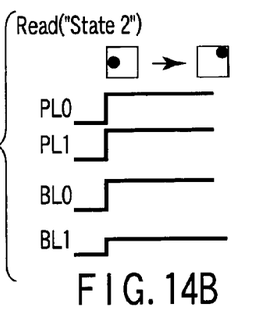

FIG. 14B shows an example of the read operation of the memory cell (in the case where the Ti-atom lies in the position "2").

The read operation is performed by raising the potential of the word line WL to set the selection transistors into the ON state. In the case where the Ti-atom lies in the position "2", the electric field is directed to an upper rightward direction if the potentials of PL0, PL1 are raised. As a result, the Ti-atom is moved by the electric field and charges are read onto the bit lines BL0, BL1. At this time, since the Ti-atom is moved from the position "2" to the upper right position, a large degree of polarization inversion occurs as viewed from BL0 and a small degree of polarization inversion occurs as viewed from BL1. Therefore, the potential of BL0 becomes higher than the potential of BL1.

Figure 14C:
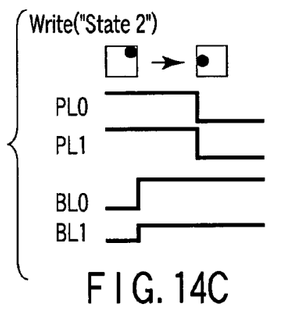

FIG. 14C shows an example of the write (rewrite) operation of writing a Ti-atom into the position "2" after the readout operation of the memory cell.

The write operation is performed by raising the potential of the word line WL to set the selection transistors into the ON state. In order to rewrite the Ti-atom into the position "2", the potentials of PL0, PL1 are selectively raised or lowered under a state where the potential of BL0 is raised to and set at the "H" level and the potential of BL1 is set at approximately intermediate potential between the "H" level and "L" level.

Figure 14D:
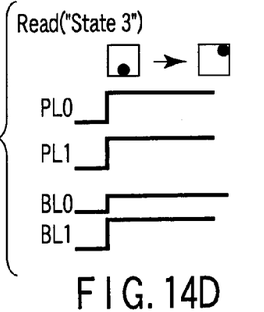

FIG. 14D shows an example of the read operation of the memory cell (in the case where the Ti-atom lies in the position "3").

When the potentials of PL0, PL1 are raised, the electric field is set in the upper rightward direction. At this time, since the Ti-atom is moved from the position "3" to the upper right position by the electric field, a large degree of polarization inversion occurs as viewed from BL1 and a small degree of polarization inversion occurs as viewed from BL0. Therefore, the potential of BL1 becomes higher than the potential of BL0.

Figure 14E:
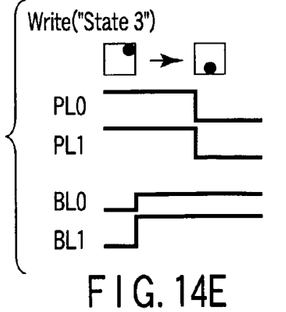

FIG. 14E shows an example of the write (rewrite) operation of writing the Ti-atom into the position "3" after the readout operation of the memory cell.

In order to rewrite the Ti-atom into the position "3", the potentials of PL0, PL1 are selectively raised or lowered in a state where the potential relation between BL0 and BL1 is reversed with respect to that in the rewrite operation of rewriting the Ti-atom into the position "2" as shown in FIG. 14C.

If the potentials of PL0, PL1 are raised when the Ti-atom lies in the position "1", the electric field is set in the upper rightward direction. The Ti-atom is moved from the position "1" to the upper right position by the electric field, the potential of BL1 is lowered and the potential of BL0 is slightly raised. Thus, this case can be distinguished from the case where the Ti-atom lies in the position "2" or "3".

When the Ti-atom is rewritten into the position "1", the potentials of PL0, PL1 are selectively raised or lowered in a state where the potential of BL0 is lowered to the "L" level and the potential of BL1 is set at approximately intermediate potential between the "H" level and "L" level.

If the potentials of PL0, PL1 are raised when the Ti-atom lies in the position "0", the electric field is set in the upper rightward direction. As a result, since the Ti-atom is moved from the position "1" to the upper right position by the electric field, the potential of BL0 is lowered and the potential of BL1 is slightly raised. Thus, this case can be distinguished from the case wherein the Ti-atom lies in the position "1", "2" or "3".

When the Ti-atom is rewritten into the position "0", the potentials of PL0, PL1 are selectively raised or lowered in a state where the potential of BL1 is lowered to the "L" level and the potential of BL0 is set at approximately intermediate potential between the "H" level and "L" level.

By performing the above operation, four-value information can be read or written with respect to the memory cell shown in FIG. 14A.

Fifteenth Embodiment

In the fifteenth embodiment, it will be explained that a developed system for providing a ferroelectric memory cell unit which is configured by connecting a ferroelectric capacitor and selection transistor in parallel and connecting a plurality of parallel-connected circuits in series as is disclosed in the senior application.

Figure 15A:
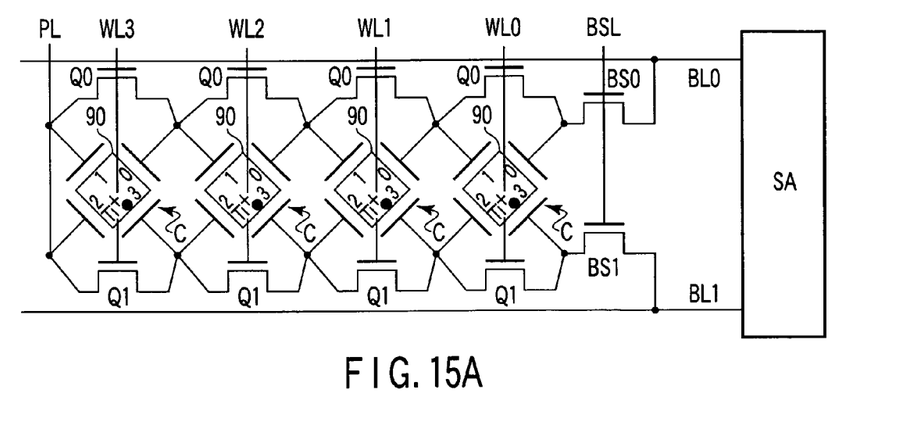
FIGS. 15A to 15C are an equivalent circuit diagram showing a ferroelectric memory cell according to a fifteenth embodiment and timing waveform diagrams showing examples of a read operation and write operation.

FIG. 15A shows an equivalent circuit of a memory cell block configured by serially connecting a plurality of ferroelectric memory cells according to the fifteenth embodiment.

A symbol of a square in FIG. 15A indicates a region of a ferroelectric film (for example, $PbZr_xTi(1-x)O_3$) 90 of a ferroelectric capacitor. Stabilized points of the Ti-atom are provided in positions of "0" to "3" shown in each of the regions and four-value information can be stored in each of the memory cells. In this case, the stabilized points of the Ti-atom are shown, but another atom may be used in the case of another perovskite structure. Four terminals corresponding to the positions "0" to "3" in the region of the ferroelectric film indicate electrodes 0 to 3 and the electrodes 0 to 3 and ferroelectric film configure one four-terminal capacitor C.

That is, each of the memory cell units includes one four-terminal capacitor C having the electrodes 0 to 3 two of which are respectively connected to the source and drain of a first selection transistor Q0 and the remaining two of which are respectively connected to the source and drain of a second selection transistor Q1. The gates of the above two selection transistors Q0, Q1 are commonly connected to a word line WLi (i=0, 1, 2, 3).

A plurality of memory cell units are connected in series to configure a memory cell block. One-side ends of the two selection transistors Q0, Q1 of the memory cell unit which lies on one side of the memory cell block are commonly connected to a plate line PL and one-side ends of the two selection transistors Q0, Q1 of the memory cell unit which lies on the other side thereof are respectively connected to bit lines BL0, BL1 via block selection transistors BS0, BS1. The gates of the block selection transistors BS0, BS1 are commonly connected to a block selection line BSL and the bit lines BL0, BL1 are connected to a sense amplifier SA as complementary paired data lines.

Figure 15B:
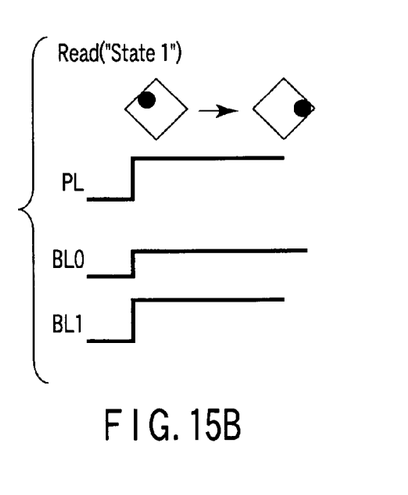

FIG. 15B shows an example of a read operation of the memory cell block. An example of the read operation is shown in the case where the memory cell unit connected to the word line WL2, for example, is selected and the Ti-atom lies in the position "1", for example, in the four-terminal capacitor of the memory cell unit.

First, in the standby state, BL0, BL1 are previously precharged to 0V. When the active state is set up, the potential of the word line WL2 is lowered to the "L" level and the potentials of the remaining word lines WL0, WL1, WL3 and block selection line BSL are raised to the "H" level, thereby to set the selection transistor of a selected memory cell into the OFF state and to set the selection transistors of the remaining non-selected memory cells and block selection transistors BS0, BS1 into the ON state. Then, the potential of the plate line PL is raised to the "H" level. As a result, voltage is applied only to the four-terminal capacitor of the selected memory cell and data thereof is read out onto the bit lines BL0, BL1.

At this time, if the potential of PL is raised when the Ti-atom lies in the position "1", the electric field is set in the right direction. The Ti-atom is moved from the upper left position to the right end position in the region of the ferroelectric film in the drawing by the electric field and charges are generated on the bit lines BL0, BL1. At this time, since the Ti-atom is moved from the position "1" to the right end position, a small degree of polarization inversion occurs as viewed from BL0 and a large degree of polarization inversion occurs as viewed from BL1. Therefore, the potential of BL1 becomes higher than the potential of BL0.

Figure 15C:
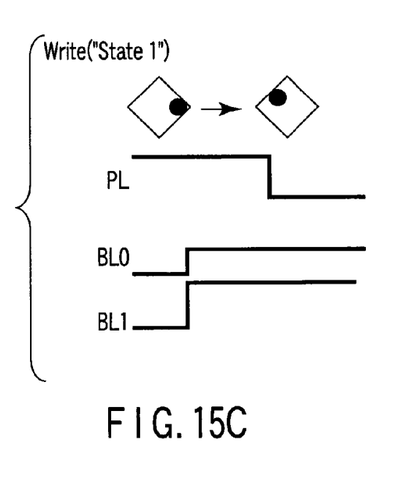

FIG. 15C shows an example of a write (rewrite) operation of writing the Ti-atom into a position "1" after the read operation of the memory cell block.

The write operation is performed by setting the selection transistor of a selected memory cell into the OFF state and setting the selection transistors of the remaining non-selected memory cells and block selection transistors BS0, BS1 into the ON state. Then, the potential of the plate line PL is selectively raised or lowered while the potential of BL1 is raised to the "H" level and the potential of BL0 is set at approximately intermediate potential between the "H" level and "L" level. As a result, the Ti-atom can be rewritten into the position "1" in the four-terminal capacitor of the selected memory cell unit.

In the case where the read/write operation is performed when the Ti-atom of the selected memory cell unit lies in the position "2", the potential relation between BL0 and BL1 may be reversed with respect to that in the case of the read/write operation performed when the Ti-atom lies in the position "1".

Further, if the potential of PL is raised in a case where the read/write operation is performed when the Ti-atom of the selected memory cell unit lies in the position "0", the electric field is set in the right direction. The Ti-atom is moved to the right end position in the region of the ferroelectric film in the drawing by the electric field and charges are generated on the bit lines BL0, BL1. At this time, since the Ti-atom is moved from the position "0", which lies on the upper right position in the region of the ferroelectric film, to the right end position, the potential of BL0 is lowered and the potential of BL1 is slightly raised. Thus, this case can be distinguished from the case where the Ti-atom lies in the position "1", "2".

When the Ti-atom is returned to the position "0", the potential of PL is selectively raised or lowered in a state where the potential of BL0 is lowered to the "L" level and the potential of BL1 is set at approximately intermediate potential between the "H" level and "L" level.

Further, if the potential of PL is raised in the case where the read/write operation is performed when the Ti-atom of the selected memory cell unit lies in the position "3", the electric field is set in the right direction. Then, the Ti-atom is moved to the right end position in the region of the ferroelectric film in the drawing by the electric field and charges are generated on the bit lines BL0, BL1. At this time, since the Ti-atom is moved from the position "3", which lies on the lower right position in the region of the ferroelectric film, to the right end position, the potential of BL1 is lowered and the potential of BL0 is slightly raised. Thus, this case can be distinguished from the case where the Ti-atom lies in the position "0", "1", "2".

When the Ti-atom is rewritten into the position "3", the potential of PL is selectively raised or lowered in a state where the potential of BL1 is lowered to the "L" level and the potential of BL0 is set at approximately intermediate potential between the "H" level and "L" level.

By performing the above operation, four-value information can be read or written with respect to each of the individual memory cell units shown in FIG. 15A.

As described above, according to the above embodiments, a ferroelectric memory device in which multi-value polarization data of three or more values can be stored in one ferroelectric film can be realized and a semiconductor memory device which can be formed with high density and high integration can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a ferroelectric element, an electric field applied to the ferroelectric element being controlled to relatively shift a position of a first atom with respect to a position of another atom and to store data at stabilized positions as remanent polarization,
wherein the ferroelectric element stores two-bit information by having total four stabilized positions of the first atom, which include first stabilized two positions in a first direction and second stabilized two positions in a second direction perpendicular to the first direction.

2. A semiconductor memory device comprising:
a ferroelectric element composed of a ferroelectric material having one structure selected from an $ABO_3$ crystal structure and an $ABO_3$ perovskite structure, both of the $ABO_3$ crystal structure and the $ABO_3$ perovskite structure being composed of atoms A, atoms B and atoms O, an electric field applied to the ferroelectric element being controlled so that a position of each of the atoms B is relatively shifted for positions of the atoms A and the atoms O to store data at the stabilized positions as remanent polarization,
wherein the ferroelectric element stores two-bit information by having total four stabilized positions of the atoms B, which include first stabilized two positions in a first direction and second stabilized two positions in a second direction perpendicular to the first direction.

3. A semiconductor memory device comprising: a ferroelectric element composed of a ferroelectric material having one structure selected from an $ABxC(1-x)O_3$ crystal structure and an $ABxC(1-x)O_3$ perovskite structure, both of the $ABxC(1-x)O_3$ crystal structure and the $ABxC(1-x)O_3$ perovskite structure being composed of at least atoms A, atoms B, atoms C and atoms O, an electric field applied to the ferroelectric element being controlled to relatively shift a position of one atom selected from the atoms B and atoms C with respect to positions of the atoms A and atoms O and permit data to be stored in stabilized positions as remanent polarization,
wherein the ferroelectric element stores two-bit information by having total four stabilized positions of one atom selected from the atoms B and atoms C, which include first stabilized two positions in a first direction and second stabilized two positions in a second direction perpendicular to the first direction.

4. The semiconductor memory device according to claim 1, wherein the operation of shifting the first atom to the four positions is performed by use of a first electric field, a second electric field in a direction opposite to the first electric field, a third electric field in a direction perpendicular to the first electric field, and a fourth electric field in a direction opposite to the third electric field.

5. The semiconductor memory device according to claim 2, wherein the operation of shifting the atom B to the four positions is performed by use of a first electric field, a second electric field in a direction opposite to the first electric field, a third electric field in a direction perpendicular to the first electric field, and a fourth electric field in a direction opposite to the third electric field.

6. The semiconductor memory device according to claim 3, wherein the operation of shifting the selected one atom to the four positions is performed by use of a first electric field, a second electric field in a direction opposite to the first electric field, a third electric field in a direction perpendicular to the first electric field, and a fourth electric field in a direction opposite to the third electric field.

7. The semiconductor memory device according to claim 1, wherein the operation of shifting the first atom to the four positions is performed by use of electric fields generated by controlling voltages applied to four electrodes arranged near the ferroelectric element.

8. The semiconductor memory device according to claim 2, wherein the operation of shifting the atom B to the four positions is performed by use of electric fields generated by controlling voltages applied to four electrodes arranged near the ferroelectric element.

9. The semiconductor memory device according to claim 3, wherein the operation of shifting the selected one atom to the four positions is performed by use of electric fields generated by controlling voltages applied to four electrodes arranged near the ferroelectric element.

10. The semiconductor memory device according to claim 1, wherein the ferroelectric element includes at least $BaTiO_3$.

11. The semiconductor memory device according to claim 2, wherein the ferroelectric element includes at least $BaTiO_3$.

12. The semiconductor memory device according to claim 3, wherein the ferroelectric element includes at least $BaTiO_3$.

13. The semiconductor memory device according to claim 1, wherein the ferroelectric element includes at least $PbZrxTi(1-x)O_3$.

14. The semiconductor memory device according to claim 2, wherein the ferroelectric element includes at least $PbZrxTi(1-x)O_3$.

15. The semiconductor memory device according to claim 1, wherein the ferroelectric element includes at least $(BiLa)_4Ti_3O_{12}$, $Bi_4Ti_3O_{12}$, $SrBi_2Ta_2O_9$.

16. A semiconductor memory device comprising:
a ferroelectric element having one structure selected from an $ABO_3$ crystal structure and an $ABO_3$ perovskite structure, both of the $ABO_3$ crystal structure and the $ABO_3$ perovskite structure being composed of at least atoms A, atoms B and atoms O, an electric field applied to the ferroelectric element being controlled to relatively shift a position of the atoms B with respect to positions of the atoms A and atoms O and permit data to be stored in stabilized positions as remanent polarization,
wherein the ferroelectric element stores multi-bit information by having total six stabilized positions of the atoms B, which include first stabilized two positions in a first direction, second stabilized two positions in a second direction perpendicular to the first direction and third stabilized two positions in a third direction perpendicular to the first and second directions.

17. A semiconductor memory device comprising:
a ferroelectric element having one structure selected from an $ABxC(1-x)O_3$ crystal structure and an $ABxC(1-x)O_3$ perovskite structure, both of the $ABxC(1-x)O_3$ crystal structure and the $ABxC(1-x)O_3$ perovskite structure being composed of at least atoms A, atoms B, atoms C and atoms O, an electric field applied to the ferroelectric element being controlled to relatively shift a position of one atom selected from the atoms B and atoms C with respect to positions of the atoms A and atoms O and permit data to be stored in stabilized positions as remanent polarization,
wherein the ferroelectric element stores multi-bit information by having total six stabilized positions of one atom selected from the atoms B and atoms C, which include two stabilized positions in a first direction, two stabilized positions in a second direction perpendicular to the first direction and two stabilized positions in a third direction perpendicular to the first and second directions.

18. A semiconductor memory device comprising:
a ferroelectric element, an electric field applied to the ferroelectric element being controlled to relatively shift a position of a first atom with respect to a position of another atom and permit data to be stored in stabilized positions as remanent polarization, wherein the ferroelectric element stores multi-bit information by having total six stabilized positions of the first atom, which include first stabilized two positions in a first direction, second stabilized two positions in a second direction perpendicular to the first direction and third stabilized two positions in a third direction perpendicular to the first and second directions.

19. The semiconductor memory device according to claim 16, wherein the operation of shifting the atom to the six positions is performed by use of a first electric field, a second electric field in a direction opposite to the first electric field, a third electric field in a direction perpendicular to the first electric field, a fourth electric field in a direction opposite to the third electric field, a fifth electric field in a direction perpendicular to the first and third electric fields, and a sixth electric field in a direction opposite to the fifth electric field.

20. The semiconductor memory device according to claim 17, wherein the operation of shifting the atom to the six positions is performed by use of a first electric field, a second electric field in a direction opposite to the first electric field, a third electric field in a direction perpendicular to the first electric field, a fourth electric field in a direction opposite to the third electric field, a fifth electric field in a direction perpendicular to the first and third electric fields, and a sixth electric field in a direction opposite to the fifth electric field.

21. The semiconductor memory device according to claim 18, wherein the operation of shifting the atom to the six positions is performed by use of a first electric field, a second electric field in a direction opposite to the first electric field, a third electric field in a direction perpendicular to the first electric field, a fourth-electric field in a direction opposite to the third electric field, a fifth electric field in a direction perpendicular to the first and third electric fields, and a sixth electric field in a direction opposite to the fifth electric field.

22. The semiconductor memory device according to claim 16, wherein the operation of shifting the atom to the six positions is performed by use of electric fields generated by controlling voltages applied to six electrodes arranged near the ferroelectric element.

23. The semiconductor memory device according to claim 17, wherein the operation of shifting the atom to the six positions is performed by use of electric fields generated by controlling voltages applied to six electrodes arranged near the ferroelectric element.

24. The semiconductor memory device according to claim 18, wherein the operation of shifting the atom to the six positions is performed by use of electric fields generated by controlling voltages applied to six electrodes arranged near the ferroelectric element.

25. The semiconductor memory device according to claim 16, wherein the ferroelectric element includes at least $BaTiO_3$.

26. The semiconductor memory device according to claim 17, wherein the ferroelectric element includes at least $BaTiO_3$.

27. The semiconductor memory device according to claim 18, wherein the ferroelectric element includes at least $BaTiO_3$.

28. The semiconductor memory device according to claim 17, wherein the ferroelectric element includes at least $PbZr_xTi(1-x)O_3$.

29. The semiconductor memory device according to claim 18, wherein the ferroelectric element includes at least $PbZr_xTi(1-x)O_3$.

30. The semiconductor memory device according to claim 18, wherein the ferroelectric element includes at least $(BiLa)_4Ti_3O_{12}$, $Bi_4Ti_3O_{12}$, $SrBi_2Ta_2O_9$.

31. A semiconductor memory device comprising:
a ferroelectric element,
wherein a first atom is shifted to at least three positions, and is stabilized at the positions on a two-dimensional plane in the ferroelectric element by applying at least three different directions of an electric field, the electric field being in parallel to the two-dimensional plane, to hold data of at least three values.

32. A semiconductor memory device comprising:
a ferroelectric element,
wherein a first atom is shifted to at least three positions, and is stabilized at the positions on a three-dimensional plane in the ferroelectric element by applying at least three different directions of an electric field in the three-dimensional plane to hold data of at least three values.

33. A semiconductor memory device comprising:
a ferroelectric element including first, second, third and fourth electrodes,
wherein a first atom in the ferroelectric element is shifted to four positions, and is stabilized at the four positions by a first bias between the first and second electrodes and a second bias between the third and fourth electrodes, and the first and second electrodes are respectively connected to source and drain terminals of a first transistor and the third and fourth electrodes are respectively connected to source and drain terminals of a second transistor to configure one memory cell and information of at least two bits is stored in the memory cell.

34. The semiconductor memory device according to claim 33, wherein a plurality of memory cells which each have the same configuration as the above memory cell are provided, the source and drain terminals of the first transistor are used as a first two-terminal, the source and drain terminals of the second transistor are used as a second two-terminal, a first two-terminal of a plurality of memory cells are series-connected to one another and a second two-terminal of the memory cells are series-connected to one another to provide a memory cell unit.

* * * * *